United States Patent [19]
Hector

[11] Patent Number: 6,001,513
[45] Date of Patent: Dec. 14, 1999

[54] METHOD FOR FORMING A LITHOGRAPHIC MASK USED FOR PATTERNING SEMICONDUCTOR DIE

[75] Inventor: Scott D. Hector, Berkeley, Calif.

[73] Assignee: Motorola, Inc., Schaumburg, Ill.

[21] Appl. No.: 09/097,801

[22] Filed: Jun. 16, 1998

[51] Int. Cl.$^6$ .................................................. G03F 9/00
[52] U.S. Cl. ........................ 430/5; 430/296; 430/394
[58] Field of Search ............................ 430/5, 296, 322, 430/394

[56] References Cited

U.S. PATENT DOCUMENTS

| | | | |
|---|---|---|---|
| 5,885,747 | 3/1999 | Yamasaki et al. | 430/5 |
| 5,885,748 | 6/1998 | Ohnuma | 430/5 |

Primary Examiner—S. Rosasco
Attorney, Agent, or Firm—James L. Clingan, Jr.

[57] ABSTRACT

A method of forming a lithographic mask, including exposing an energy beam on a first selected spot (118) on the patterning layer of a mask substrate, within a selected portion (117) on the patterning layer, and exposing an energy beam on a second selected spot (122) on the patterning layer. The selected portion corresponds to a lithographic feature (116) and has a boundary (128) including a plurality of boundary segments defining a polygon. The energy beam is exposed on the first selected spot (118) at a first dosage, and at the second selected spot (122) at a second dosage that does not equal the first dosage. According to the present invention, a lithographic feature (116) is provided on the lithographic mask and includes a serif (126), a portion of which is provided by altering the dosage level at the second selected spot.

18 Claims, 3 Drawing Sheets

METHOD FOR FORMING A LITHOGRAPHIC MASK USED FOR PATTERNING SEMICONDUCTOR DIE

BACKGROUND OF THE INVENTION

The present invention is drawn to a lithographic mask, particularly a method for forming a lithographic mask used for patterning semiconductor die.

As is known in the art of semiconductor processing, lithographic masks are commonly employed in connection with patterning of resists, such as photoresists, deposited on a semiconductor wafer. By irradiating an energy source through the mask, a pattern formed in a layer on the mask is replicated onto the resist deposited on the semiconductor die or wafer. Energy sources include ultraviolet (UV), deep ultraviolet (DUV), extreme ultraviolet (EUV), as well as x-ray, electron and ion beams. With respect to UV, DUV, and EUV, it is well known that at times the pattern contained within the mask is not exactly replicated on the photoresist of the semiconductor die. For example, diffraction of DUV rays along corners or ends of a feature of the pattern may cause inexact replication of the pattern. Such is illustrated with particularity in connection with the drawings.

Turning to FIG. 1, a basic cross-section of a lithographic mask 1 is illustrated. Lithographic mask 1 includes a substrate layer 10, having a film 12 patterned thereon. The substrate layer 10 may be made of any one of various materials, depending upon the particular energy source employed. For example, in the case of DUV photolithography, film 12 is comprised of chromium, and substrate 10 is formed of fused silica. In this case, the lithographic feature 16 provided within photoresist 14 is transferred to film 12 by etching an exposed region of film 12. Accordingly, upon irradiating the lithographic mask 1 with a DUV energy source, DUV energy passes through substrate 10. Thereafter, a first portion of the energy is absorbed by film 12, and a second portion of the energy is unobstructed by film 12 (i.e., passes through the lithographic feature, corresponding to those portions of film 12 that are patterned). Accordingly, the lithographic feature from the lithographic mask is replicated along the resist provided on the semiconductor die.

It is noted that the general operation of patterning a resist on a semiconductor die utilizing a lithographic mask as described above is set forth in connection with a DUV process. However, the lithographic mask 1 may easily be configured for use with other exposure methods, including EUV, etc. Such masks are well known in the art.

FIG. 2 illustrates an attempt of replicating lithographic feature 16 onto semiconductor die 8, in the case of a negative resist on the semiconductor die 8. Here, it is shown that the lithographic feature 16 is not precisely replicated onto the semiconductor die 8. Indeed, only a portion of the feature is replicated, corresponding to adequately exposed region 18, leaving behind inadequately exposed region 20. This imprecise replication is due to diffraction effects at opposite ends of the lithographic feature known as "line end shortening". In an attempt to address this problem, it is common in the art to incorporate serifs. In this technique, the lithographic feature provided on the lithographic mask 16 is modified to include a serif 26 as illustrated in FIG. 3. By expanding the area of exposure at each end of the lithographic feature, the serif is effective to mitigate the effects of diffraction, and better replicate the desired lithographic feature.

The addition of serifs to the lithographic feature provided on the mask has proved effective. In this regard, generally the database, particularly a computer-aided design (CAD) database, that defines the lithographic feature is modified so as to include serifs. For example, the CAD database may be modified manually by a designer such that the data include serifs. In addition, automated routines are known in the art to add serifs to CAD databases. However, both manual and automated addition of serifs is laborious, as such databases typically contain several gigabytes. As such, addition of serifs in one mask set for a semiconductor die may actually take days to complete, thereby adding cost and complexity to the process for fabricating a mask. The present inventor has recognized a need in the art to provide an improved method of forming a lithographic mask having serifs, which is more cost effective, is relatively simple, and which reduces the cycle time for mask manufacture.

DETAILED DESCRIPTION OF THE DRAWINGS

Figure 1:
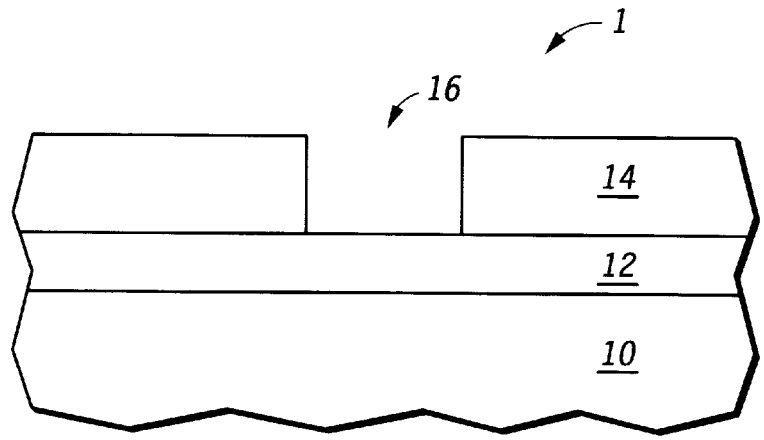
FIG. 1 is a basic cross-section illustrating components of a prior art lithographic mask.
Figure 2:
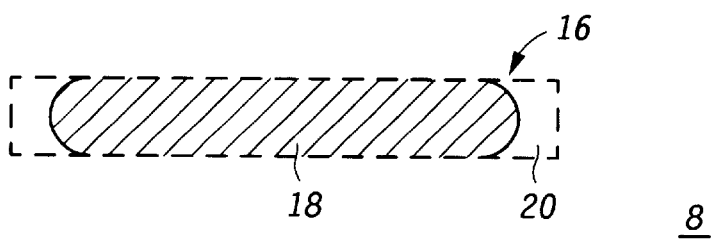
FIG. 2 illustrates exposure of a semiconductor die utilizing a conventional lithographic mask.
Figure 3:
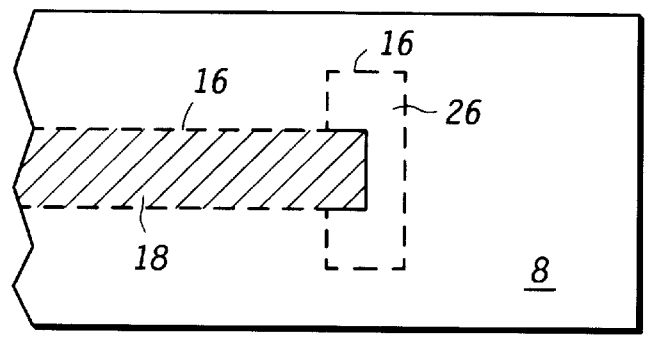
FIG. 3 illustrates exposure of a semiconductor die utilizing another conventional lithographic mask.
Figure 4:
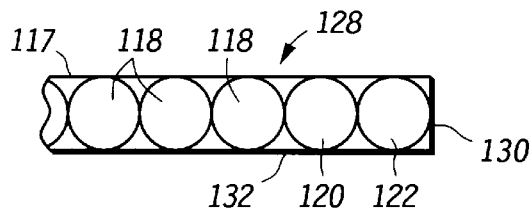
FIG. 4 illustrates exposure of a selected area to form a pattern on a lithographic mask according to an embodiment of the present invention.

According to embodiments of the present invention disclosed herein, a method for forming a lithographic mask is disclosed that efficiently forms lithographic features having corrective serifs. FIG. 4 illustrates exposure of selected portion 117 along a resist layer formed on a mask substrate, defined by a boundary 128. Although not shown, the mask substrate generally includes a substrate layer and a patterning film overlying the substrate layer, on which is deposited a resist. According to the present invention, an energy beam is "stepped", or more precisely, a series of spots are irradiated along selected portion 117. The energy beam may be a photon beam or a charged particle beam, more particularly, a laser beam or an electron beam, respectively. In each case, the energy beam is focused to form a spot which is stepped within the selected portion. As shown in FIG. 4, a plurality of first selected spots 118 are irradiated consecutively, at a first dosage shown in FIG. 5. Then, as exposure proceeds along boundary segment 132 and nears the end boundary, more particularly, boundary segment 130 of boundary 128, the dosage is increased to a second dosage. Here, dosages increase consecutively from second selected spot 120 to third selected spot 122. Thus, it is quite clear that the dosage at spot 122 intersecting first boundary segment 130 is different than the dosage associated with the plurality of first selected spots 118. Since dosage is a function of both intensity and exposure duration at each spot, either intensity, exposure duration, or both, may be increased so as to increase the dosage at selected spots 120, 122. Generally, it is preferable to increase exposure duration.

Figure 6:
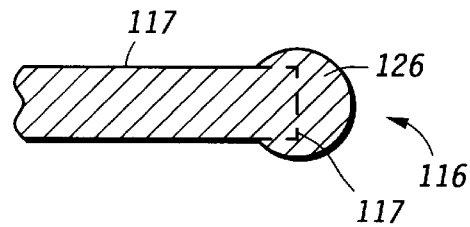
FIG. 6 illustrates the resulting lithographic feature provided by the exposure methodology described in connection with FIGS. 4 and 5.

FIG. 6 illustrates the resultant lithographic feature 116 which is formed on the resist overlying the mask substrate. Here, it is seen that because of increased exposure at second and third selected spots 120, 122, a serif 126 is formed, which is larger than the selected area 117 shown in connection with FIG. 4. Here, the serif is effective to accommodate diffraction effects during patterning a semiconductor die to form a line pattern thereon corresponding to lithographic features. The mask containing the lithographic feature 116 may be used to make a number of features along the semiconductor die. For example, the lithographic feature 116 may correspond to an electrical interconnect.

Figure 5:
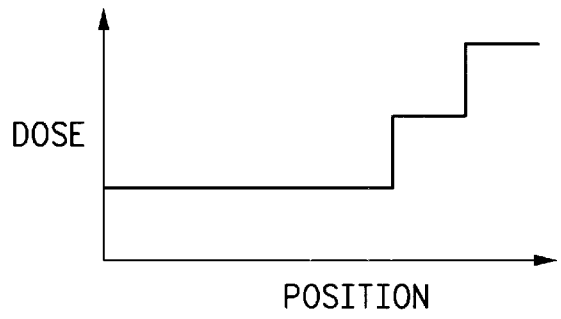
FIG. 5 is a graph illustrating dosage versus position along the selected portion shown in FIG. 4.

It is noted that the above description in connection with FIGS. 4–6 is set forth with respect to use of a negative photoresist for forming the lithographic feature on the lithographic mask. However, a positive photoresist may also be utilized, in which case exposure dosages at spots 120 and 122 would be reduced, rather than increased, to form serif 126.

Figure 7:
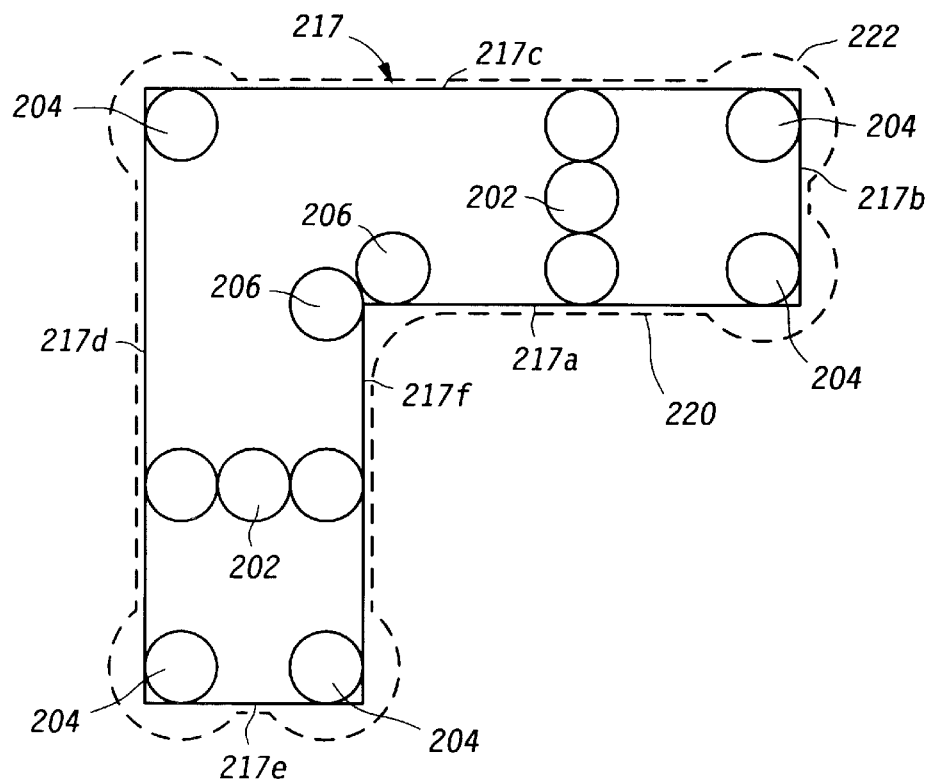
FIG. 7 illustrates application of an embodiment of the present invention to several areas of a selected portion having a different configuration with respect to that shown in FIGS. 4 and 6.
Figure 8:
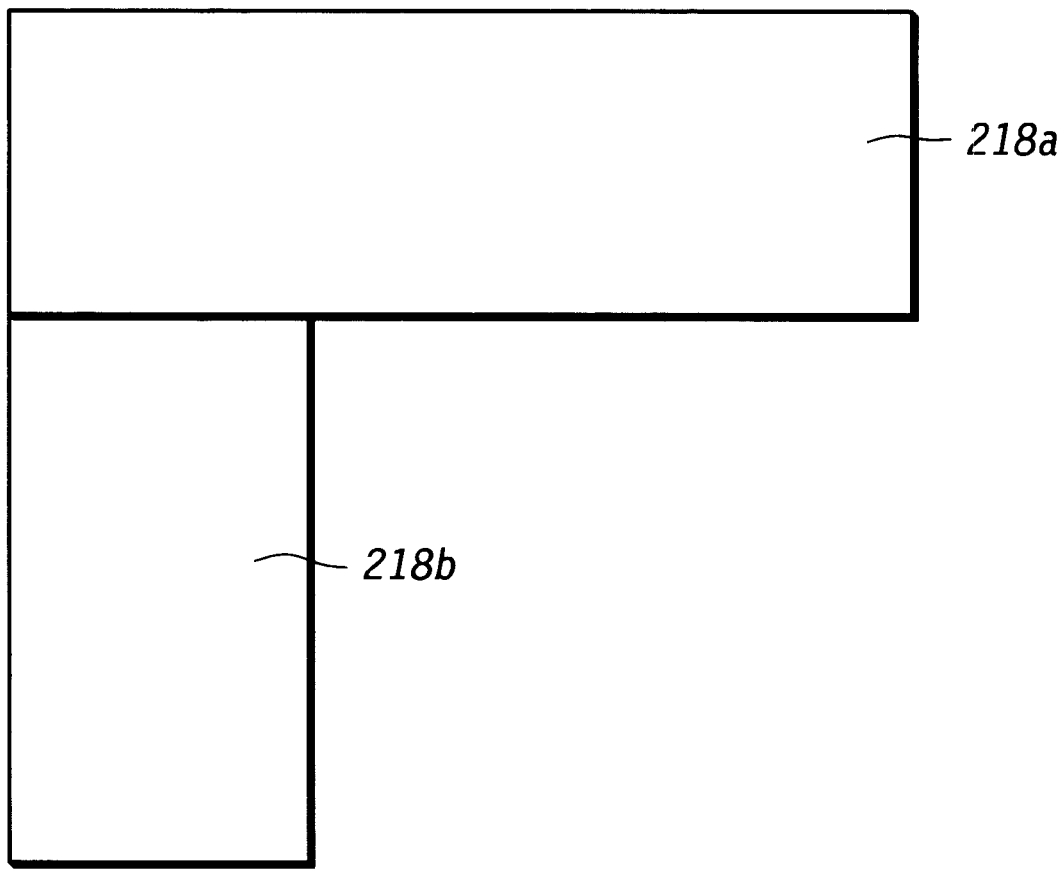
FIG. 8 illustrates the selected portion of FIG. 7, broken into two rectangular portions.

FIG. 7 illustrates application of the present invention to selected portion 217, having a configuration different from that shown above. Here, selected portion 217 includes rectangular portions 218a and 218b of a polygon as shown in FIG. 8, and includes first through sixth boundary segments 217a through 217f. Only some of the selected spots are illustrated in FIG. 7 for clarity, including a plurality of interior selected spots 202, and vertex selected spots 204, 206. The interior spots 202 are all generally exposed at the same dosage. However, selected spots 204, each provided at a vertex of the polygon, has an associated different dosage. As above, in the case of a negative photoresist, the dosage associated with selected spots 204 is increased (or decreased in the case of a positive photoresist). Unlike the selected portion 117 described above in connection with FIG. 4, selected portion 217 has an interior vertex, defined by the intersection between boundary segments 217a and 217f. In the case of a negative photoresist, this interior vertex is typically over-exposed according to the prior art because the same dose associated with the selected spots 202 is used throughout exposure. Accordingly, selected spots 206 defining the interior vertex have an associated dosage which is less than the dosages in connection with interior selected spots 202 (for a negative photoresist). By manipulating the dosages at selected spots provided along an interior of the selected portion and along vertices of the selected portion, a desired lithographic feature 220 is provided, as represented by the phantom lines. As shown, a plurality of serifs 222 are provided, each of which is effective to account for diffraction effects during patterning of the resist on the semiconductor die. In the case of a mask for DUV photoresist patterning, this lithographic feature 220 is etched into a patterning film, such as a Cr containing patterning film, overlying a substrate layer of a mask substrate. The mask is defined after patterning of the patterning film.

Following formation of a lithographic mask according to the present invention, the mask is then used to lithographically define features in a semiconductor device. Generally, a second energy beam (i.e. an energy beam other the first energy beam used to form the mask) is irradiated through the mask and onto a resist formed on a semiconductor die, the resist is developed, and the semiconductor die is patterned using conventional techniques. The semiconductor die are generally in wafer form at this stage.

Accordingly, a novel method for forming a lithographic mask is disclosed herein, wherein serifs may be easily incorporated into lithographic features on a lithographic mask. The process is simplified, as dosages at critical areas may be manipulated during the exposure procedure, rather than by designing in serifs into a CAD database defining a set of lithographic features. Here, rather than modifying the CAD database, the posting database (which translates the CAD data to beam-writing commands) may be modified, which is greatly simplified over modifying the CAD database. That is, the CAD database is not modified so as to add additional geometrical information. Rather, the set of beam-writing commands supplied to the writing tool, or the command structure operating the writing tool, is modified so as to have differing dosage levels associated with critical selected spots.

While the present invention has been described above with particularity in connection with several embodiments, it is to be understood that modifications and improvements may be made to the present invention without departing from the scope of the claims attached hereto.

What is claimed is:

1. A method of forming a lithographic mask, comprising the steps of:

providing a mask substrate;

defining a first pattern which matches a desired pattern for application to a semiconductor wafer, said pattern characterized as identifying a plurality of spots on the mask substrate;

providing a patterning layer overlying the mask substrate;

exposing an energy beam on a first subset of the plurality of spots on the patterning layer at a first dosage to expose a first portion of the desired pattern; and exposing the energy beam on a second subset of the spots on the patterning layer at a second dosage that does not equal the first dosage to expose a second portion of the desired pattern plus serifs on the patterning layer.

2. The method of claim 1, further comprising forming the desired pattern on a semiconductor die.

3. The method of claim 1, further comprising forming the first pattern plus serifs in the patterning layer, forming the first pattern plus serifs in the mask substrate to form the lithographic mask, and using the lithographic mask to form the desired pattern on a semiconductor die.

4. The method of claim 3, wherein the mask is used to define an electrical interconnect on a semiconductor die, the electrical interconnect corresponding to the desired pattern.

5. The method of claim 4, wherein the energy beam is an electron beam.

6. The method of claim 4, wherein the energy beam is a laser.

7. The method of claim 1, wherein the energy beam is a photon beam or a charged particle beam.

8. The method of claim 7, wherein the energy beam is an electron beam or a laser beam.

9. The method of claim 1, wherein the mask substrate comprises a substrate layer and a film overlying the substrate layer, the patterning layer is a resist, and the method further comprises steps of:

developing the resist to expose portions of the film; and etching the portions of the film to form the desired pattern plus serifs.

10. The method of claim 1, wherein the first dosage and the second dosage are a function of an intensity of the energy beam and a duration of exposure of the energy beam, wherein the intensity of the energy beam at the second subset of spots is different than intensity of the energy beam at the first subset of spots.

11. The method of claim 1, wherein the first dosage and the second dosage are a function of an intensity of the energy beam and a duration of exposure of the energy beam, wherein the duration of exposure of the energy beam at the second subset of spots is different than duration of exposure of the energy beam at the first subset of spots.

12. A method of patterning a semiconductor device, comprising the steps of:

provrding a mask formed by:

providing a mask substrate including a substrate layer and a film overlying the substrate layer;

providing a resist overlying the mask substrate;

defining a first pattern which matches a desired pattern for application to a semiconductor wafer, said pattern characterized as identifying a plurality of spots on the mask substrate;

exposing an energy beam on a first subset of spots on the resist, wherein the energy beam is exposed on the first subset of spots at a first dosage to expose a first portion of the desired pattern;

exposing an energy beam on a second subset of spots on the resist, wherein the energy beam is exposed on the second subset of spots at a second dosage that does not equal the first dosage to expose a second portion of the desired pattern plus serifs on the patterning layer;

developing the resist to expose portions of the film;

etching the portions of the film; and removing the resist;

irradiating a second energy beam through the mask and onto a second resist, formed on a semiconductor die;

developing the second resist; and patterning the semiconductor die.

13. The method of claim 12, wherein the semiconductor die is one of a plurality of semiconductor die provided in wafer form.

14. The method of claim 12, wherein etching portions of the first resist results in the desired pattern plus serifs.

15. The method of claim 12, wherein patterning the semiconductor wafer results in the desired pattern.

16. The method of claim 15, wherein the mask is used to define an electrical interconnect on a semiconductor die, the electrical interconnect corresponding to the desired pattern.

17. The method of claim 12, wherein the first dosage and the second dosage are a function of an intensity of the energy beam and a duration of exposure of the energy beam, wherein the intensity of the energy beam at the second subset of spots is different than intensity of the energy beam at the first subset of spots.

18. The method of claim 12, wherein the first dosage and the second dosage are a function of an intensity of the energy beam and a duration of exposure of the energy beam, wherein the duration of exposure of the energy beam at the second subset of spots is different than duration of exposure of the energy beam at the first subset of spots.

* * * * *